US012615707B2

(12) United States Patent
Liao et al.

(10) Patent No.: US 12,615,707 B2
(45) Date of Patent: Apr. 28, 2026

(54) CONFINEMENT AND PROTECTION OF A THERMAL INTERFACE MATERIAL BETWEEN A HEAT SINK AND AN ELECTRONIC DEVICE

(71) Applicant: Super Micro Computer, Inc., San Jose, CA (US)

(72) Inventors: Yi-Kuan Liao, Taoyuan City (TW); Kuan-Lin Peng, Taoyuan City (TW)

(73) Assignee: Super Micro Computer, Inc., San Jose, CA (US)

( * ) Notice: Subject to any disclaimer, the term of this patent is extended or adjusted under 35 U.S.C. 154(b) by 257 days.

(21) Appl. No.: 18/365,729

(22) Filed: Aug. 4, 2023

(65) Prior Publication Data

US 2025/0048530 A1 Feb. 6, 2025

(51) Int. Cl.
*H05K 1/02* (2006.01)

(52) U.S. Cl.
CPC ..... *H05K 1/0203* (2013.01); *H05K 2201/066* (2013.01)

(58) Field of Classification Search
CPC ... H01L 23/367; H01L 23/3677; H01L 23/42; H01L 2224/32245; G06F 1/20; H05K 1/0203; H05K 1/0204; H05K 2201/066; H05K 1/181; H05K 7/20154
See application file for complete search history.

(56) References Cited

U.S. PATENT DOCUMENTS

| | | | | |
|---|---|---|---|---|
| 6,016,006 A * | 1/2000 | Kolman | ......... | H01L 23/42 |
| | | | | 361/705 |
| 7,336,487 B1 * | 2/2008 | Chrysler | ......... | H01L 23/473 |
| | | | | 361/679.48 |
| 2003/0085475 A1 * | 5/2003 | Im | ......... | H01L 23/16 |
| | | | | 257/796 |
| 2004/0017656 A1 * | 1/2004 | Lee | ......... | H01L 23/42 |
| | | | | 174/15.2 |
| 2007/0127211 A1 * | 6/2007 | Macris | ......... | H01L 23/42 |
| | | | | 257/E23.09 |
| 2007/0183128 A1 * | 8/2007 | Pirillis | ......... | H05K 9/0058 |
| | | | | 361/715 |
| 2008/0106868 A1 * | 5/2008 | Hoss | ......... | H01L 23/3737 |
| | | | | 257/E23.102 |
| 2013/0322023 A1 * | 12/2013 | Kim | ......... | H01L 23/4334 |
| | | | | 361/720 |
| 2017/0064862 A1 * | 3/2017 | Miyoshi | ......... | H01L 23/32 |
| 2017/0188448 A1 * | 6/2017 | Liang | ......... | H01L 23/42 |
| 2018/0358280 A1 * | 12/2018 | Gandhi | ......... | H01L 23/04 |
| 2018/0374715 A1 * | 12/2018 | Stathakis | ......... | H01L 23/24 |
| 2019/0045666 A1 * | 2/2019 | Liang | ......... | H01L 23/42 |
| 2024/0249996 A1 * | 7/2024 | Flynn | ......... | H01L 21/4817 |

OTHER PUBLICATIONS

"Interference Fit", Wikipedia, downloaded Jul. 27, 2023, https://en.wikipedia.org/wiki/Interference_fit.
"Liquid Metal", Wikipedia, downloaded Jul. 27, 2023, https://en.wikipedia.org/wiki/Liquid_metal.
"Material Compatibility in Immersion Cooling", Open Compute Project, Nov. 28, 2022.

* cited by examiner

*Primary Examiner* — Adam B Dravininkas
(74) *Attorney, Agent, or Firm* — Beyer Law Group LLP

(57) ABSTRACT

Disclosed is an electronic assembly that includes a heat sink with a groove that is cut on a surface of the heat sink. A thermal interface material is disposed between the heat sink and an electronic device. A compressible filler disposed in the groove surrounds and confines the thermal interface material.

20 Claims, 5 Drawing Sheets

CONFINEMENT AND PROTECTION OF A THERMAL INTERFACE MATERIAL BETWEEN A HEAT SINK AND AN ELECTRONIC DEVICE

TECHNICAL FIELD

The present disclosure is directed to cooling of electronic devices.

BACKGROUND

Electronic devices, such as central processing units (CPUs), graphics processing units (GPUs), and application-specific integrated circuits (ASICs), generate a lot of heat and accordingly needs to be cooled for proper operation. One way of cooling an electronic device is to attach a heat sink to the electronic device. The heat sink serves as a heat exchanger that dissipates heat generated by the electronic device to the ambient space in air cooling or to a coolant in immersion cooling. A thermal interface material disposed between the electronic device and the heat sink facilitates heat transfer from the electronic device to the heat sink. Examples of thermal interface materials include thermal pad, thermal grease, thermal putty, graphite sheet, phase change material, liquid metal, etc. The thermal interface material is pasted or spread on a flat surface of the heat sink, which is then attached to the electronic device.

The thermal interface material may spill over when compressed between the heat sink and the electronic device, especially when the thermal interface material is in liquid phase. The thermal interface material may thus leak out and dirty nearby components, ruin integrated circuit (IC) sockets, cause electrical shorts or other permanent damage, etc.

Compatibility issues limit the selection of thermal interface materials for immersion cooling. For example, thermal grease cannot be employed in immersion cooling that uses hydrocarbon oil as a coolant, because the hydrocarbon oil will wash out the thermal grease and reduce its thermal transfer ability over time. Also, the washed-out thermal grease will change the property of the hydrocarbon oil.

Typically, there is no specific mechanism designed to confine the thermal interface material. In applications where the thermal interface material is electrically conductive and in liquid phase at high temperatures, such as the case with liquid metal, a sponge or gasket is glued directly to the flat surface of the heat sink to surround the thermal interface material. The sponge and glue are not oil-resistant, thereby limiting their use in immersion cooling. The sponge and glue also do not provide a robust structure and may still result in thermal interface material leakage. Tape and foam may also be used to confine the thermal interface material, but has similar issues as sponge and glue in terms of preventing thermal interface material leakage.

Embodiments of the present invention allow the thermal interface material to be confined within a specific region to prevent leakage, prevent deterioration of the thermal interface material, and allow for a wider selection of thermal interface materials.

BRIEF SUMMARY

In one embodiment, an electronic assembly comprises a heat sink, an electronic device, a thermal interface material, and a compressible filler. The heat sink has a first groove that is cut on a surface of the heat sink. The thermal interface material is disposed between the heat sink and the electronic device, is attached to the surface of the heat sink and to a surface of the electronic device, and is disposed within a perimeter of the compressible filler. The compressible filler is disposed in the first groove to completely surround and confine the thermal interface material.

In another embodiment, an electronic assembly comprises a heat sink, an electronic device, a thermal interface material, and a compressible filler. The heat sink has a continuous groove that is cut on a bottom surface of the heat sink. The thermal interface material is disposed between the heat sink and the electronic device, wherein the thermal interface material directly contacts the bottom surface of the heatsink and directly contacts a top surface of the electronic device. The compressible filler is disposed in the continuous groove without an adhesive and completely surrounds the thermal interface material.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference labels refer to the same elements throughout the figures. The figures are not drawn to scale.

DETAILED DESCRIPTION

In the present disclosure, numerous specific details are provided, such as examples of assemblies, components, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
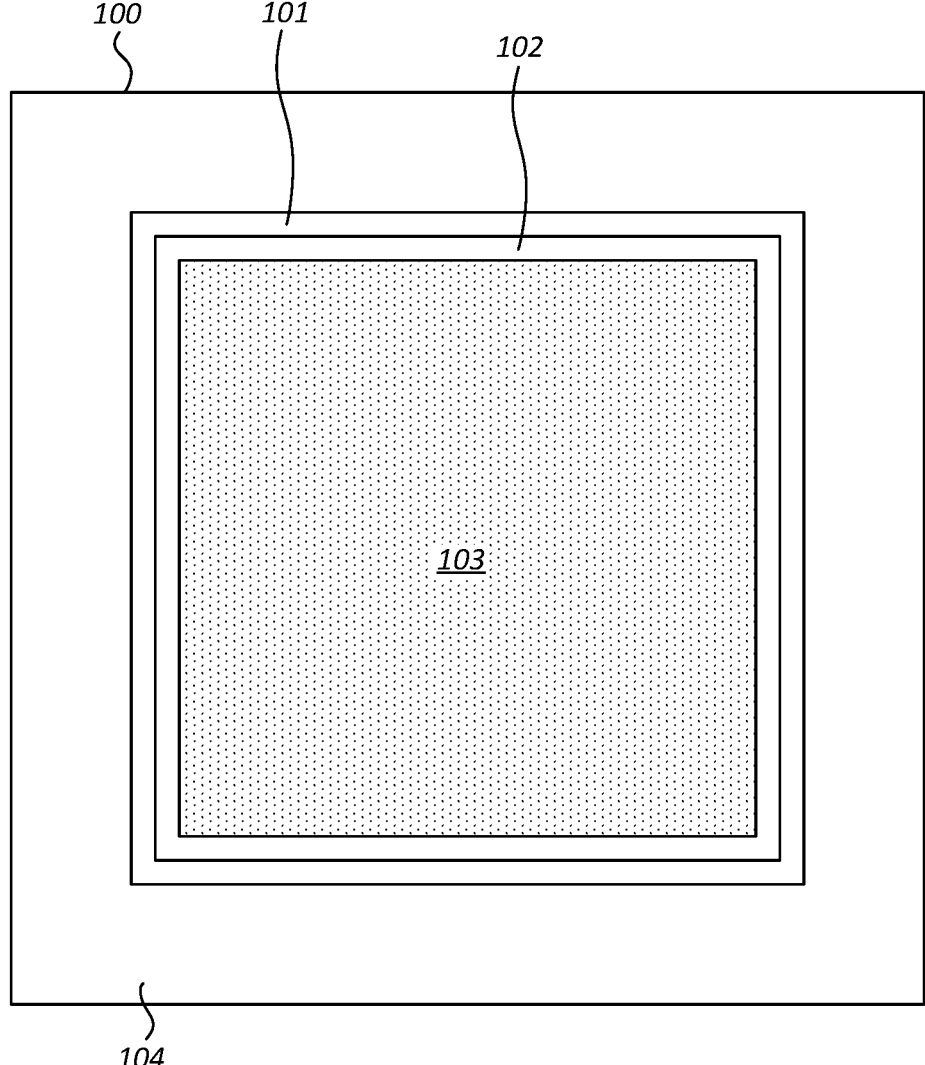
FIG. 1 shows a schematic plan view of a bottom side of a heat sink in accordance with an embodiment of the present invention.

FIG. 1 shows a schematic plan view of a bottom side of a heat sink 100 in accordance with an embodiment of the present invention. The bottom side serves as the base of the heat sink 100. The bottom side has a relatively flat and smooth bottom surface 104, except for a continuous groove 101 that is cut on the bottom surface 104. A thermal interface material 103 is applied on the bottom surface 104, with the groove 101 forming a closed perimeter that completely surrounds the thermal interface material 103. The groove 101 may be a trench, slot, or other structure that forms a depth relative to the plane of the bottom surface 104 to hold and constrain a compressible filler (e.g. see FIG. 3, compressible filler 152). Between the groove 101 and the ther-

US 12,615,707 B2

Figure 3:
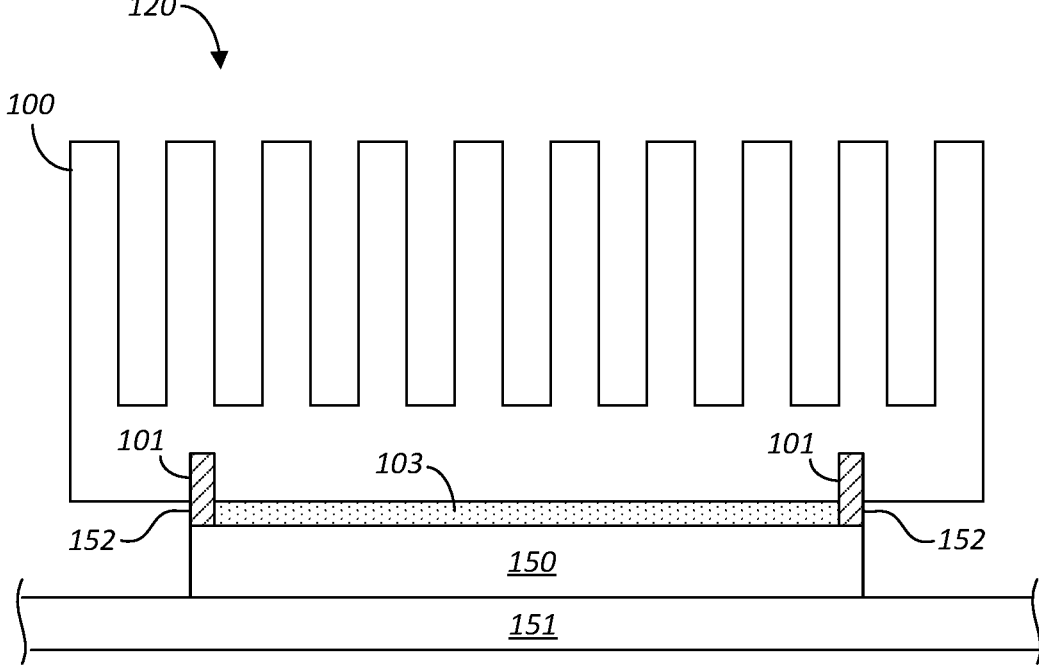

3 mal interface material 103 is a spillover region 102, into which the thermal interface material 103 spills over when compressed between the heat sink 100 and an electronic device (e.g. see FIG. 3, electronic device 150).

Figure 2:
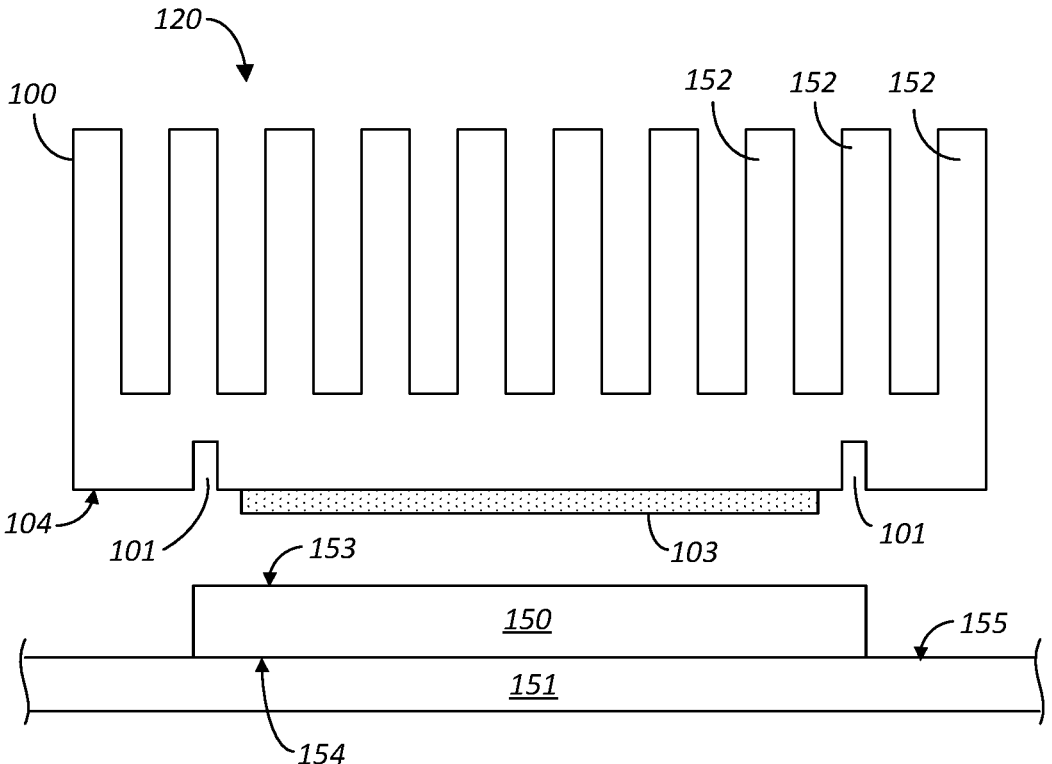
FIGS. 2 and 3 show schematic cross-sectional views of an electronic assembly, in accordance with an embodiment of the present invention.

FIG. 2 shows a schematic cross-sectional view of an electronic assembly 120 in accordance with an embodiment of the present invention. In the example of FIG. 2, the heat sink 100 is shown as having a plurality of fins 152 for illustration purposes. As can be appreciated, the heat sink 100 may also be a cold plate or other heat dissipation structure.

FIG. 2 shows the heat sink 100 before being attached to an electronic device 150 (e.g., CPU, GPU, ASIC, etc.). The electronic device 150 is mounted on a surface 155 of the substrate 151, which in one embodiment is a printed circuit board (PCB). The substrate 151 may be a motherboard of a server computer, for example. In the example of FIG. 2, the thermal interface material 103 is applied directly to the bottom surface 104 and within the perimeter of the groove 101. A top surface 153 of the electronic device 150 faces toward the thermal interface material 103, and a bottom surface 154 of the electronic device 150 faces toward the substrate 151.

FIG. 3 shows a schematic cross-sectional view of the electronic assembly 120 in accordance with an embodiment of the present invention. FIG. 3 shows the heat sink 100 after being attached to the electronic device 150. A compressible filler 152 is inserted in the groove 101 and is compressed together with the thermal interface material 103 to the top surface 153 (labeled in FIG. 2) of the electronic device 150 when the heat sink 100 is attached to the electronic device 150. The compressible filler 152 and the thermal interface material 103 directly contact the top surface 153 of the electronic device 150 when pressed against the electronic device 150. The thermal interface material 103 spills over to the spillover region 102 (labeled in FIG. 1) when compressed against the electronic device 150.

In the example of FIG. 3, the groove 101 does not extend outside of a perimeter of the electronic device 150. More particularly, in the example of FIG. 3, the groove 101 may line up with or be slightly within the perimeter of the electronic device 150. Heat generated by the electronic device 150 is transferred to the heat sink 100 by way of the thermal interface material 103.

The compressible filler 152 completely surrounds the thermal interface material 103. The compressible filler 152 is securely held and constrained in the groove 101, and provides a continuous, robust structure that confines the thermal interface material 103 within the perimeter of the compressible filler 152 and prevents external fluids from reaching the thermal interface material 103. The thermal interface material 103 is thereby prevented from leaking outside of the perimeter of the compressible filler 152 and is protected from coolant contamination in immersion cooling applications.

The compressible filler 152 may comprise rubber or other compressible material that is suitable for the particular cooling application. For example, the compressible filler 152 may be a rubber sponge. The compressible filler 152 is continuous and follows the shape/outline of the groove 101. The compressible filler 152 may be inserted in the groove 101 by interference fit without any glue or other adhesive. Not using an adhesive advantageously allows for wider selection of suitable thermal interface material for a particular cooling application.

Figure 4:
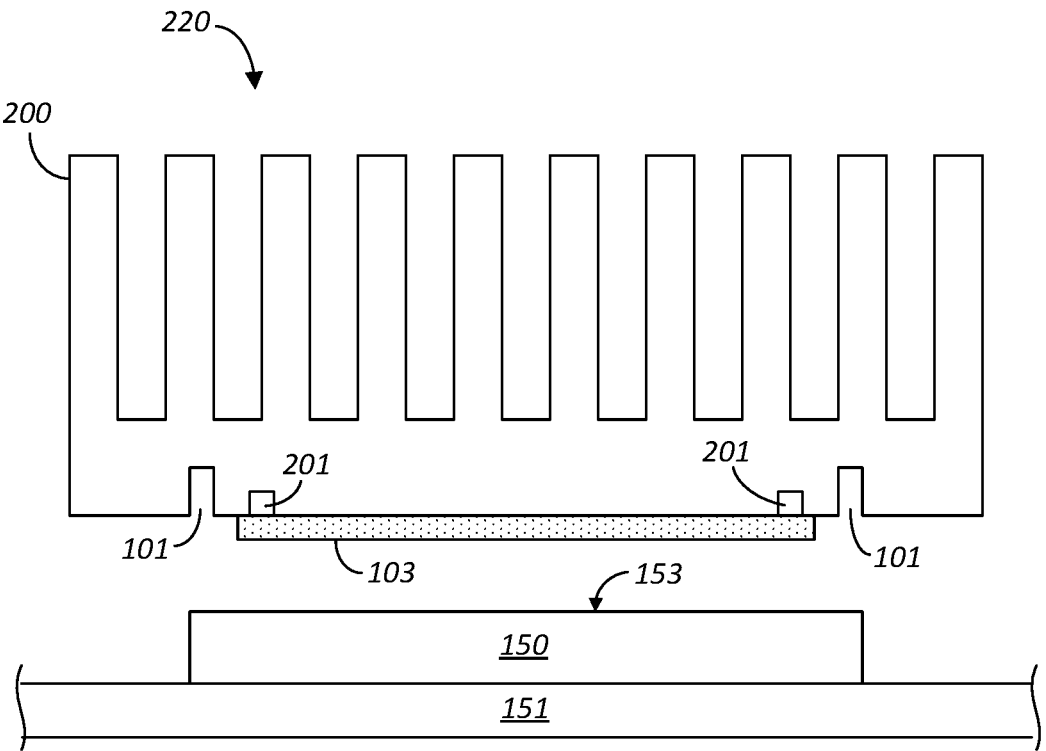
FIGS. 4 and 5 show schematic cross-sectional views of an electronic assembly, in accordance with another embodiment of the present invention.

FIG. 4 shows a schematic cross-sectional view of an electronic assembly 220 in accordance with an embodiment of the present invention. In the example of FIG. 4, a heat sink 200 is the same as the heat sink 100 of the electronic assembly 120 except for the addition of a continuous spillover groove 201 inside the perimeter of the groove 101. The spillover groove 201 has the same shape and structure as the groove 101, except that the depth of the spillover groove 201 is shallower than that of the groove 101. The spillover groove 201 is spaced apart from the groove 101. Components of the electronic assemblies 220 and 120 that have the same reference labels are otherwise the same.

Figure 5:
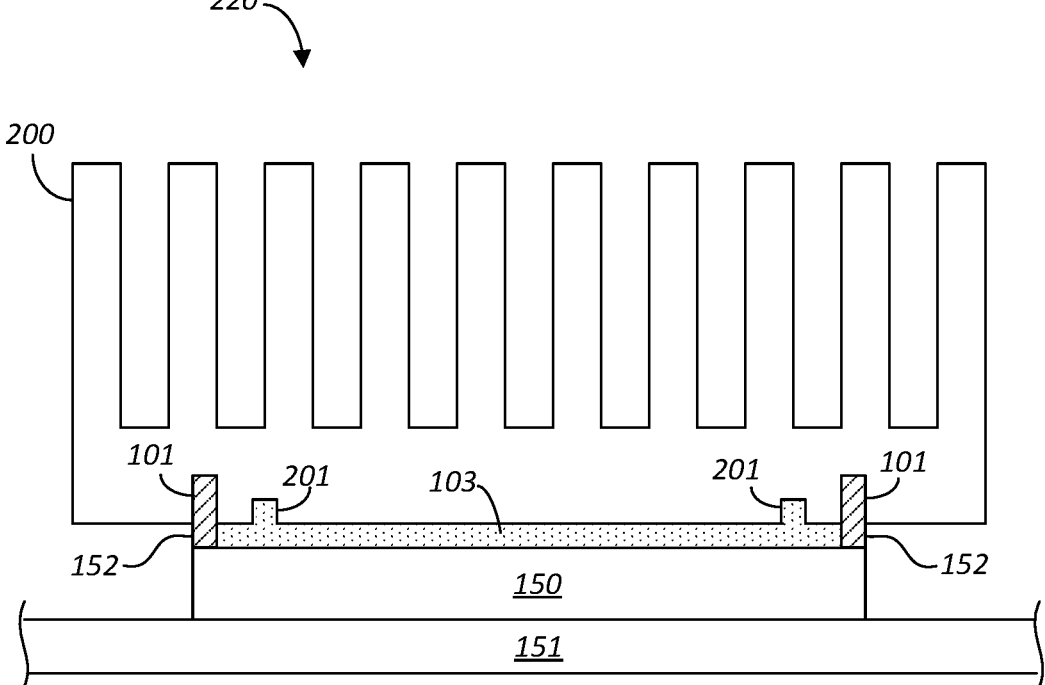

FIG. 5 shows a schematic cross-sectional view of the electronic assembly 220 in accordance with an embodiment of the present invention. FIG. 5 shows the heat sink 200 after being attached to the electronic device 150. As before, the compressible filler 152 is inserted in the groove 101 and is compressed together with the thermal interface material 103 against the top surface 153 (labeled in FIG. 4) of the electronic device 150 when the heat sink 200 is attached to the electronic device 150. The thermal interface material 103 spills into the spillover groove 201 when compressed against the electronic device 150. Note that the portion of the thermal interface material 103 in the spillover groove 201 does not contact the compressible filler 152 in the groove 101.

When compressed, the thermal interface material 103 exerts a shear force that may result in the thermal interface material 103 being thicker in the corners than in the central area. The spillover groove 201 receives spillover thermal interface material 103, allowing the thermal interface material 103 to be uniformly applied across the electronic device 150.

Figure 6:
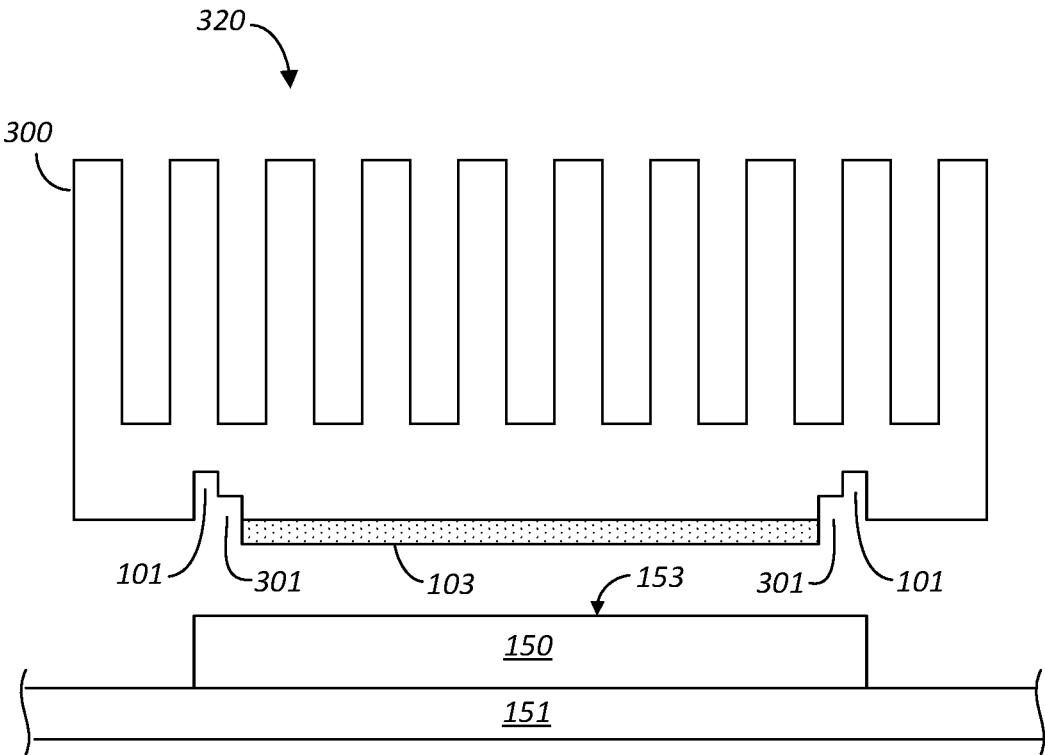
FIGS. 6 and 7 show schematic cross-sectional views of an electronic assembly, in accordance with yet another embodiment of the present invention.

FIG. 6 shows a schematic cross-sectional view of an electronic assembly 320 in accordance with an embodiment of the present invention. In the example of FIG. 6, a heat sink 300 is the same as the heat sink 200 of the electronic assembly 220 except for a continuous spillover groove 301. The spillover groove 301 is the same as the spillover groove 201 of the heatsink 200 except that the spillover groove 301 is directly adjacent to the groove 101. Same as the spillover groove 201 of the heat sink 200, the spillover groove 301 of the heat sink 300 is within the perimeter of the groove 101 and has a depth that is shallower than that of the groove 101. Components of the electronic assemblies 320 and 220 that have the same reference labels are otherwise the same.

Figure 7:
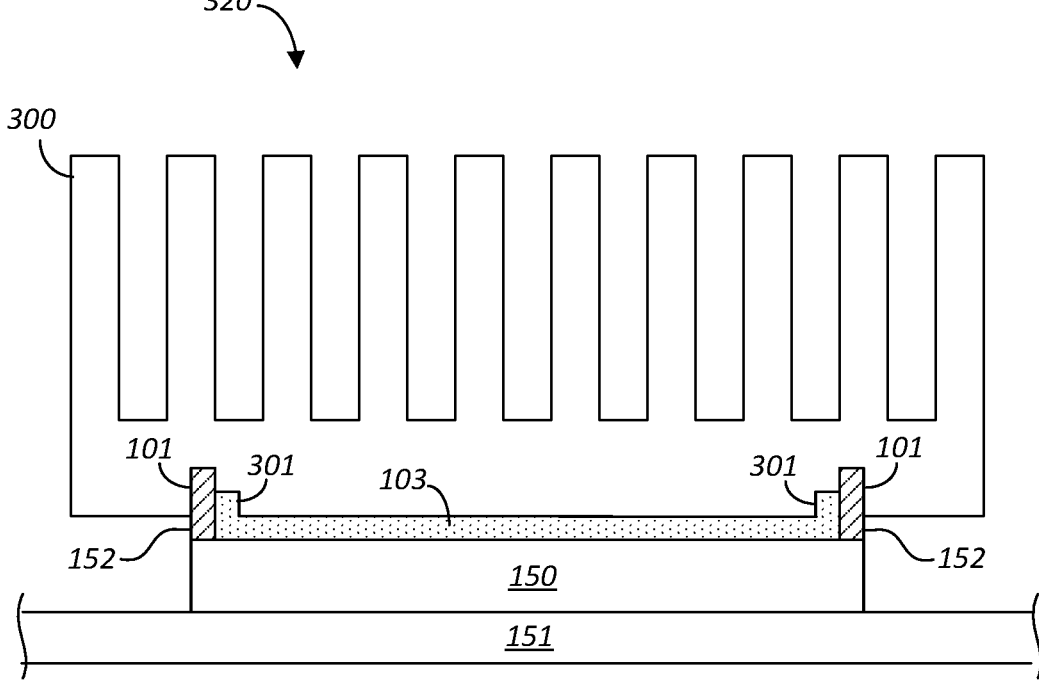

FIG. 7 shows a schematic cross-sectional view of the electronic assembly 320 in accordance with an embodiment of the present invention. FIG. 7 shows the heat sink 300 after being attached to the electronic device 150. As before, the compressible filler 152 is inserted in the groove 101 and is compressed along with the thermal interface material 103 against the top surface 153 (labeled in FIG. 6) of the electronic device 150 when the heat sink 300 is attached to the electronic device 150. The thermal interface material 103 spills into the spillover groove 301 when compressed against the electronic device 150. In contrast to the spillover groove 201 of the heat sink 200, the portion of the thermal interface material 103 in the spillover groove 301 directly contacts the compressible filler 152 in the groove 101.

Figure 8:
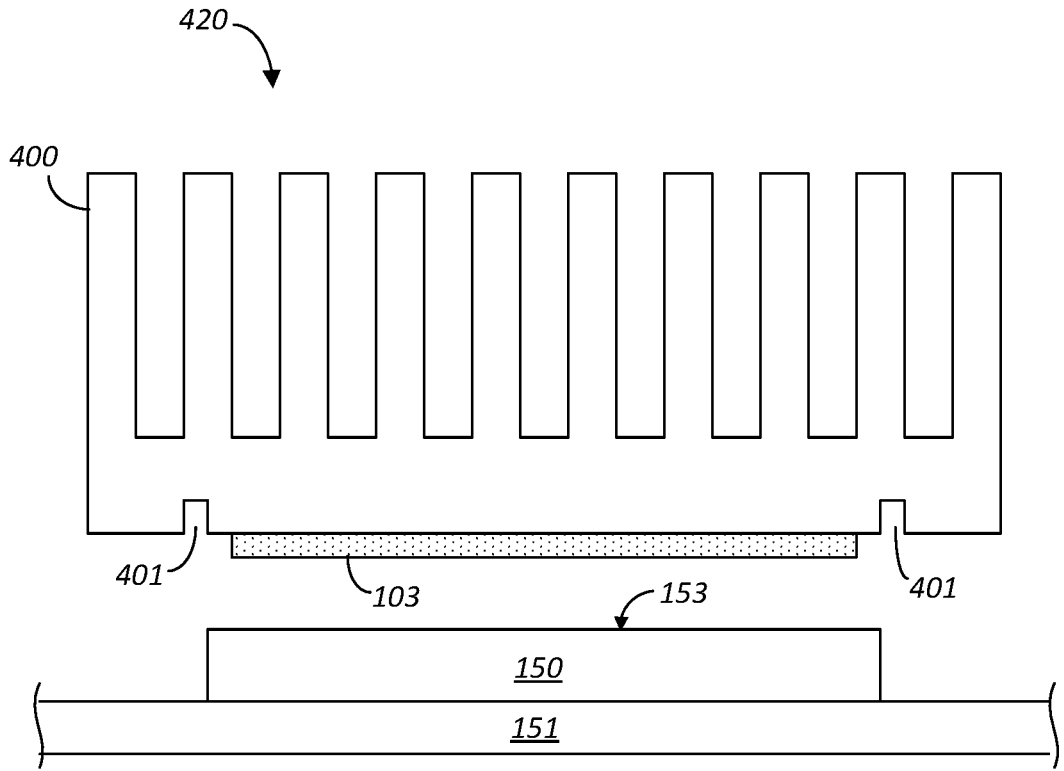
FIGS. 8 and 9 show schematic cross-sectional views of an electronic assembly, in accordance with yet another embodiment of the present invention.

FIG. 8 shows a schematic cross-sectional view of an electronic assembly 420 in accordance with an embodiment of the present invention. In the example of FIG. 8, a heat sink 400 is the same as the heat sink 100 of the electronic assembly 120 except for a continuous groove 401. The groove 401 is the same as the groove 101 of the heat sink 100 except that the groove 401 is outside the perimeter of the electronic device 150, when the heat sink 400 attached to the electronic device 150. This results in a compressible filler 402 (shown in FIG. 9) in the groove 401 to be outside the perimeter of the electronic device 150. Components of the electronic assembles 120 and 420 that have the same reference labels are otherwise the same.

Figure 9:
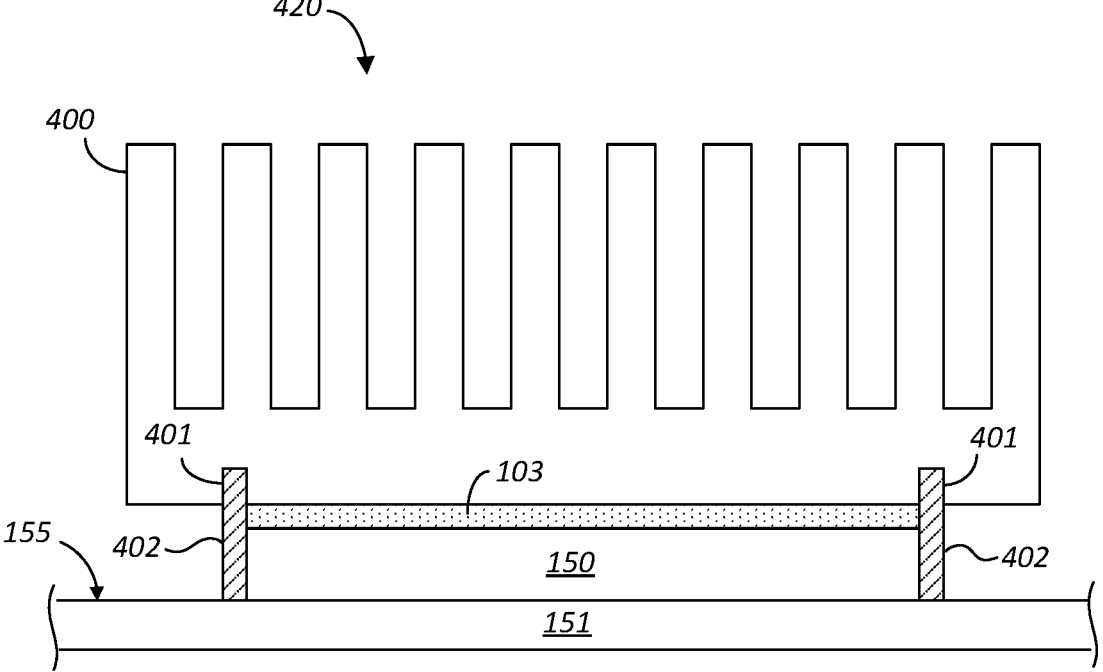

FIG. 9 shows a schematic cross-sectional view of the electronic assembly 420 in accordance with an embodiment of the present invention. FIG. 9 shows the heat sink 400 after being attached to the electronic device 150. The compressible filler 402 is inserted in the groove 401 and is compressed toward the substrate 151 along with the thermal interface material 103 when the heat sink 400 is attached to the electronic device 150. The thermal interface material 103 is compressed against the top surface 153 (labeled in FIG. 8) of the electronic device 150, whereas the compressible filler 402 is compressed against the surface 155 of the substrate 151. Same as the compressible filler 152 of the electronic assembly 120, the compressible filler 402 may comprise rubber or other suitable compressible material. For example, the compressible filer 402 may be rubber sponge.

The compressible filler 402 is continuous and follows the shape/outline of the groove 401. The compressible filler 402 completely surrounds the electronic device 150 and the thermal interface 103. By placing the groove 401 outside the perimeter of the electronic device 150, the groove 401 may be made shallower compared to the groove 101 of the heatsink 100 of the electronic assembly 120, and the compressible filler 402 is disposed on the sides rather than the top of the electronic device 150. This configuration improves heat transfer performance and slightly enlarges the coverage area of the thermal interface material 103 on the electronic device 150.

The thermal interface material 103 may comprise liquid metal, thermal grease, or other thermal interface material that is suitable for a particular cooling application. As can be appreciated, embodiments of the present invention allow for a wider selection of thermal interface materials. For example, embodiments of the present invention allow thermal grease to be used as the thermal interface material in immersion cooling, because the compressible filler (152, 402) in the groove (101, 401) of the embodiments prevents leakage of the thermal grease and prevents contact between the thermal grease and the coolant.

Electronic assemblies disclosed herein may be immersed in a coolant of an immersion cooling system. As can be appreciated, although embodiments of the present invention are especially advantageous in immersion cooling systems, the embodiments are equally advantageous when employed in air-cooled systems or other cooling systems.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An electronic assembly comprising:
   a heat sink, the heat sink having a first groove that is cut on a surface of the heat sink;
   an electronic device;
   a thermal interface material that is disposed between the heat sink and the electronic device, the thermal interface material is attached to the surface of the heat sink and to a surface of the electronic device; and
   a compressible filler disposed in the first groove, the compressible filler completely surrounds the thermal interface material and confines the thermal interface material within a perimeter of the compressible filler, wherein the heatsink has a second groove that is cut on the surface of the heat sink directly adjacent to and within a perimeter of the first groove, the second groove is shallower than the first groove and contains a spillover portion of the thermal interface material that directly contacts the compressible filler.

2. The electronic assembly of claim 1, wherein the heatsink further comprises:
   a second groove that is cut on the surface of the heat sink,
   wherein the second groove is within a perimeter of the first groove and contains a spillover portion of the thermal interface material.

3. The electronic assembly of claim 1, wherein the compressible filler contacts the surface of the electronic device.

4. The electronic assembly of claim 1, further comprising:
   a substrate,
   wherein the electronic device is mounted on a surface of the substrate.

5. The electronic assembly of claim 4, wherein the compressible filler contacts the surface of the substrate.

6. The electronic assembly of claim 1, wherein the compressible filler is disposed outside a perimeter of the electronic device.

7. The electronic assembly of claim 1, wherein the electronic assembly is immersed in a coolant of an immersion cooling system.

8. The electronic assembly of claim 1, wherein the electronic device is a central processing unit (CPU), a graphics processing unit (GPU), or an application-specific integrated circuit (ASIC).

9. The electronic assembly of claim 1, wherein the compressible filler is held in the first groove without an adhesive.

10. The electronic assembly of claim 1, wherein the compressible filler is held in the first groove by interference fit.

11. The electronic assembly of claim 1, wherein the thermal interface material comprises thermal grease or liquid metal.

12. An electronic assembly comprising:
   a heat sink having a continuous groove that is cut on a bottom surface of the heat sink;
   an electronic device;
   a thermal interface material that is disposed between the heat sink and the electronic device, wherein the thermal interface material directly contacts the bottom surface of the heatsink and directly contacts a top surface of the electronic device; and
   a compressible filler that is disposed in the continuous groove without an adhesive and completely surrounds the thermal interface material,
   wherein the heatsink has a spillover groove that is cut on the bottom surface of the heat sink directly adjacent to and within a perimeter of the continuous groove, the spillover groove is shallower than the continuous groove and contains a spillover portion of the thermal interface material that directly contacts the compressible filler.

13. The electronic assembly of claim 12, further comprising:
   a spillover groove that is cut on the bottom surface of the heat sink, wherein the spillover groove contains a spillover portion of the thermal interface material.

14. The electronic assembly of claim 12, wherein the continuous groove extends outside a perimeter of the electronic device.

15. The electronic assembly of claim 12, wherein the compressible filler directly contacts the top surface of the electronic device.

16. The electronic assembly of claim 12, further comprising:

a printed circuit board (PCB), wherein the electronic device is mounted on a surface of the PCB.

17. The electronic assembly of claim 16, wherein the compressible filler directly contacts the surface of the PCB.

18. The electronic assembly of claim 12, wherein the compressible filler is held in the continuous groove by interference fit.

19. The electronic assembly of claim 12, wherein the thermal interface material comprises liquid metal or thermal grease.

20. The electronic assembly of claim 12, wherein the compressible filler comprises rubber.

\* \* \* \* \*